United States Patent
Stiens et al.

(10) Patent No.: US 9,976,213 B2
(45) Date of Patent: May 22, 2018

(54) TOOL HAVING CVD COATING

(71) Applicant: Walter AG, Tübingen (DE)

(72) Inventors: Dirk Stiens, Reutlingen (DE); Sakari Ruppi, Tübingen (DE); Thorsten Manns, Tübingen (DE)

(73) Assignee: Walter AG, Tübingen (DE)

( * ) Notice: Subject to any disclaimer, the term of this patent is extended or adjusted under 35 U.S.C. 154(b) by 39 days.

(21) Appl. No.: 14/781,622

(22) PCT Filed: Apr. 16, 2014

(86) PCT No.: PCT/EP2014/057720
§ 371 (c)(1),
(2) Date: Oct. 1, 2015

(87) PCT Pub. No.: WO2014/173755
PCT Pub. Date: Oct. 30, 2014

(65) Prior Publication Data
US 2016/0053372 A1 Feb. 25, 2016

(30) Foreign Application Priority Data
Apr. 26, 2013 (DE) .......... 10 2013 104 254

(51) Int. Cl.
C23C 16/34 (2006.01)
C23C 16/44 (2006.01)

(52) U.S. Cl.
CPC .............. *C23C 16/34* (2013.01); *C23C 16/44* (2013.01)

(58) Field of Classification Search
USPC .......... 51/307, 309; 428/336, 697, 698, 699, 428/701, 702; 407/119; 427/255.23,
(Continued)

(56) References Cited

U.S. PATENT DOCUMENTS 5,879,823 A * 3/1999 Prizzi .................. C23C 14/0641
428/699
6,238,739 B1 * 5/2001 Madar ..................... C23C 16/34
427/255.391
(Continued)

FOREIGN PATENT DOCUMENTS

CN 1857836 A 11/2006
CN 102672214 A 9/2012
(Continued)

OTHER PUBLICATIONS

Anderbouhr et al "LPCVD and PACVD (Ti,Al)N films; morphology and mechanical properties" Surf & Techn (1999) 115 p. 103-110.*
(Continued)

*Primary Examiner* — Archene Turner
(74) *Attorney, Agent, or Firm* — Morgan, Lewis & Bockius LLP

(57) ABSTRACT

A tool having a base body of carbide, cermet, ceramic, steel or high speed steel and a single-layer or multi-layer wear-protection coating applied thereto in a CVD process, wherein the wear-protection coating has at least one $Ti_{1-x}Al_xC_yN_z$ layer having stoichiometry coefficients $0.70 \leq x < 1.0$, $y < 0.25$ and $0.75 \leq z < 1.15$ wherein the $Ti_{1-x}Al_xC_yN_z$ layer is of a thickness of 1 μm to 25 μm and has a crystallographic preferential orientation, which is characterized by a ratio of the intensities of the X-ray diffraction peaks of the crystallographic {111} plane and the {200} plane, wherein $I\{111\}/I\{200\} > 1 + h \,(\ln h)^2$, wherein h is the thickness of the $Ti_{1-x}Al_xC_yN_z$ layer in micrometer.

25 Claims, 7 Drawing Sheets

X-ray diffractogram coating No 4 (invention)

(58) Field of Classification Search
USPC .......... 427/255.28, 255.36, 255.39, 255.391
See application file for complete search history.

(56) References Cited

U.S. PATENT DOCUMENTS

| | | | |
|---|---|---|---|
| 6,254,984 B1* | 7/2001 | Iyori | C23C 28/044 428/697 |
| 6,382,951 B1* | 5/2002 | Soderberg | C04B 41/009 428/698 |
| 6,824,601 B2 | 11/2004 | Yamamoto et al. | |
| 7,531,212 B2* | 5/2009 | Kohara | C23C 8/02 427/255.31 |
| 7,767,320 B2 | 8/2010 | Endler | |
| 7,837,416 B2* | 11/2010 | Omori | B23B 27/1662 407/119 |
| 8,257,841 B2 | 9/2012 | Endler et al. | |
| 8,389,134 B2 | 3/2013 | Van Den Berg et al. | |
| 8,394,513 B2 | 3/2013 | Van Den Berg et al. | |
| 8,702,912 B2 | 4/2014 | Tabersky et al. | |
| 8,748,016 B2 | 6/2014 | Endler et al. | |
| 2007/0178330 A1 | 8/2007 | Sjolen et al. | |
| 2008/0260947 A1* | 10/2008 | Gates | C23C 16/36 427/255.394 |
| 2009/0074521 A1 | 3/2009 | Larsson et al. | |
| 2009/0123779 A1* | 5/2009 | Endler | C23C 16/34 428/697 |
| 2009/0274899 A1 | 11/2009 | Sundstrom et al. | |
| 2012/0219789 A1* | 8/2012 | Endler | C23C 16/34 427/255.394 |
| 2013/0224519 A1 | 8/2013 | Inspektor et al. | |

FOREIGN PATENT DOCUMENTS

| | | |
|---|---|---|
| DE | 69920093 T2 | 6/2005 |
| DE | 102005032860 A1 | 1/2007 |
| DE | 60124061 T2 | 4/2007 |
| DE | 102007000512 B3 | 1/2009 |
| DE | 102009046667 A1 | 5/2011 |
| EP | 1017870 B1 | 10/2002 |
| EP | 2 570 511 A1 | 3/2013 |
| JP | 2001-341008 A | 12/2001 |
| WO | 2009/112115 A1 | 9/2009 |
| WO | 2009/112116 A1 | 9/2009 |
| WO | 2009/112117 A1 | 9/2009 |
| WO | 2009/127344 A1 | 10/2009 |
| WO | 2012/069475 A1 | 5/2012 |

OTHER PUBLICATIONS

Endler et al., Aluminum-rich TiAlCN coatings by Low Pressure CVD, Surface & Coatings Technology, Elsevier, 205: pp. 1307-1312, Nov. 25, 2010.
International Search Report and Written Opinion dated Jul. 2, 2014 for International application No. PCT/EP2014/057720.
German Search Report in 10 2013 104 254.6 dated Dec. 4, 2013.
International Preliminary Report on Patentability dated Oct. 27, 2015, for the corresponding International application No. PCT/EP2014/057720.
Spiess et al., Moderne Röntgenbeugung, 2nd edition, Vieweg & Teubner, pp. 387-392, 426, and 468-470, 2009.
Notification of the First Office Action for Chinese Patent Application No. 201480022401.5, dated Feb. 6, 2017.

* cited by examiner

Tool with coating No 9 (state of the art)
FF = relief surface; SF = rake surface Tool with coating No 8 (state of the art)
FF = relief surface; SF = rake surface Tool with coating No 1 (invention)

FF = relief surface; SF = rake surface

X-ray diffractogram coating No 4 (invention)

X-ray diffractogram coating No 8 (state of the art)

Inverse pole figure for the normal direction of the coating No 1 (invention)

Section through pole figure of the X-ray diffractogram after integration over β of coating No 1 (invention)

Section through the radiographically measured pole figure of the {111} reflection of the fcc $Ti_{1-x}Al_xC_yN_z$ layer after integration over β of coating No 2 (invention)

TOOL HAVING CVD COATING

The present application is a U.S. National Phase Application of International Application No. PCT/EP2014/057720, filed 16 Apr. 2014, which claims priority to German Application No. 10 2013 104 254.6, filed 26 Apr. 2013.

The invention concerns a tool having a base body of carbide, cermet, ceramic, steel or high speed steel and a single-layer or multi-layer wear-protection coating applied thereto in a CVD process, wherein the wear-protection coating has at least one $Ti_{1-x}Al_xC_yN_z$ layer having stoichiometry coefficients $0.70 \leq x < 1$, $0 \leq y < 0.25$ and $0.75 \leq z < 1.15$, and with a crystallographic preferential orientation. The invention further concerns a process for the production of such a tool.

BACKGROUND OF THE INVENTION

Cutting inserts for material machining, in particular for cutting metal machining, comprise a substrate body of carbide, cermet, ceramic, steel or high speed steel which in most cases is provided with a single-layer or multi-layer carbide coating for improving the cutting and/or wearing properties. The carbide coating comprises mutually superposed layers of monometallic or mixed-metallic carbide phases. Examples of monometallic carbide phases are TiN, TiC, TiCN and $Al_2O_3$. Examples of mixed-metallic phases in which in a crystal one metal is partially replaced by another are TiAlN and TiAlCN. Coatings of the above-indicated kind are applied by CVD processes (chemical vapour phase deposit), PCVD processes (plasma-assisted CVD processes) or PVD processes (physical vapour phase deposit).

It has been found that certain preferential orientations of crystal growth in the deposit in the PVD or CVD process can have particular advantages, in which respect different preferential orientations of given layers of a coating can also be particularly advantageous for different uses of the cutting insert. The preferential orientation of growth is generally specified in relation to the plane of the crystal lattice, defined by way of the Miller index and is referred to as the crystallographic texture (for example fibre texture).

DE 10 2005 032 860 discloses a carbide coating with a layer of cubically face-centred $T_{1-x}Al_xC_yN_z$ with an Al content of $0.75 \leq z < 0.93$ and a process for the production thereof.

DE 10 2007 000 512 discloses a carbide coating with a layer of TiAlN which is deposited on a first layer of TiN, TiCN or TiC deposited directly on the substrate, and a bonding layer provided between the two layers, with a phase gradient. The layer of TiAlN has a preferential orientation of crystal growth with respect to the (200) plane of the crystal lattice.

Laid-open specifications WO 2009/112115, WO 2009/112116 and WO 2009/112117A1 disclose TiAlN and TiAlCN layers deposited by means of CVD processes with a high Al proportion and a cubically face-centred lattice, but no crystallographic preferential orientations of crystal growth are described.

TiAlN coatings produced by means of PVD processes, with various crystallographic preferential orientations of crystal growth, are known, but PVD coatings with cubically face-centred lattices of the TiAlN coatings, in contrast to CVD coatings are restricted to Al contents of less than 67%. TiAlN coatings with a crystallographic preferential orientation of the {200} plane with respect to the growth direction of the crystallites are described as advantageous for metal machining (for example US 2009/0274899, US 2009/0074521 and WO 2009/127344).

OBJECT

The object of the present invention was to provide cutting inserts for cutting metal machining, in particular turning and milling machining of steel or cast materials, which have improved wear resistance over the state of the art.

DESCRIPTION OF THE INVENTION

That object is attained by a process for the production of a tool having a base body of carbide, cermet, ceramic, steel or high speed steel and a single-layer or multi-layer wear-protection coating applied thereto in a CVD process, wherein the wear-protection coating has at least one $Ti_{1-x}Al_xC_yN_z$ layer having stoichiometry coefficients $0.70 \leq x < 1$, $0 \leq y < 0.25$ and $0.75 \leq z < 1.15$ and of a thickness in the range of 1 μm to 25 μm, wherein for production of the $Ti_{1-x}Al_xC_yN_z$ layer a) the bodies to be coated are placed in a substantially cylindrical CVD reactor designed for an afflux flow on the bodies to be coated with the process gases in a direction substantially radially relative to the longitudinal axis of the reactor, b) two precursor gas mixtures (VG1) and (VG2) are provided, wherein the first precursor gas mixture (VG1) contains 0.005% to 0.2 vol-% $TiCl_4$,
0.025% to 0.5 vol-% $AlCl_3$ and
as a carrier gas hydrogen ($H_2$) or a mixture of hydrogen and nitrogen ($H_2/N_2$), and the second precursor gas mixture (VG2) contains 0.1 to 3.0 vol-% of at least one N-donor selected from ammonia ($NH_3$) and hydrazine ($N_2H_4$), and as a carrier gas hydrogen ($H_2$) or a mixture of hydrogen and nitrogen ($H_2/N_2$), and the first precursor gas mixture (VG1) and/or the second precursor gas mixture (VG2) optionally contains a C-donor selected from acetonitrile ($CH_3CN$), ethane ($C_2H_6$), ethene ($C_2H_4$) and ethyne ($C_2H_2$) and mixtures thereof, wherein the total vol-% proportion of N-donor and C-donor in the precursor gas mixtures (VG1, VG2) is in the range of 0.1 to 3.0 vol-%, c) the two precursor gas mixtures (VG1, VG2) are kept separate before passing into the reaction zone and are introduced substantially radially relative to the longitudinal axis of the reactor at a process temperature in the CVD reactor in the range of 600° C. to 850° C. and a process pressure in the CVD reactor in the range of 0.2 to 18 kPa, wherein the ratio of the volume gas flows ($\dot{V}$) of the precursor gas mixtures (VG1, VG2) $\dot{V}(VG1)/\dot{V}(VG2)$ is less than 1.5.

In accordance with the present invention vol-% proportions in the precursor gas mixtures relate to the total volume of the gas mixture introduced into the reaction zone and comprising the first and second precursor gas mixtures.

It was surprisingly found that the process implementation according to the invention makes it possible to produce $Ti_{1-x}Al_xC_yN_z$ and $Ti_{1-x}Al_xN_z$ layers with stoichiometry coefficients $0.70 \leq x < 1$, $0 < y < 0.25$ and $0.75 \leq z < 1.15$ and with a cubically face-centred lattice, which have a pronounced preferential orientation of crystal growth with respect to the {111} plane of the crystal lattice. In comparison with known coatings with TiAlCN and TiAlN layers, in particular those with preferential orientation of crystal growth with respect to the {200} plane of the crystal lattice, the coatings according to the invention have outstanding properties in metal machining. It was further surprisingly found that, in the case of a cutting insert with a coating of the kind described herein, in cutting metal machining, in particular in turning and milling of steel or cast materials, it is possible to achieve a wear resistance which is improved over known cutting inserts and a wider range of applications.

In the CVD process according to the invention two precursor gas mixtures (VG1) and (VG2) are prepared, wherein the first precursor gas mixture (VG1) contains the metals Ti and Al in the form of their chlorides and carrier gas and the second precursor gas mixture (VG2) contains at least one N-donor. In general only N-donor ammonia ($NH_3$) or hydrazine ($N_2H_4$) is used for the production of a pure TiAlN layer. For the production of the TiAlCN layer N-donor and C-donor are used, for example ammonia ($NH_3$) mixed with ethene ($C_2H_4$). In the process according to the invention acetonitrile ($CH_3CN$) acts predominantly as a C-donor and is accordingly used in the mixture with an N-donor. Depending on the respectively desired stoichiometry it is possible to use mixtures with further N-donors and C-donors. For the process according to the invention it is necessary for the N-donor to be supplied separately from the chlorides of the metals Ti and Al, but in contrast the C-donor can be supplied both by way of the first precursor gas mixture (VG1) and also by way of the second precursor gas mixture (VG2). In a further preferred embodiment of the invention the N-donor is ammonia ($NH_3$).

The CVD process used according to the invention is an MT-CVD process at a process temperature in the CVD reactor in the range of 600° C. to 850° C. and a process pressure in the range of 0.2 to 18 kPa. The CVD reactor is a substantially cylindrical reactor which is designed for an afflux flow to the bodies to be coated with the process gases in a direction substantially radially relative to the longitudinal axis of the reactor, that is to say from the central axis of the cylindrical reactor in the direction of the outer walls of the reactor, that are formed by the cylinder casing. Such cylindrical reactors are known and commercially available, for example the CVD coating systems of type Bernex®BPXpro from Ionbond AG, Olten, Switzerland.

An essential process step in the process according to the invention is that the two precursor gas mixtures (VG1) and (VG2) are kept separate prior to passing into the reaction zone. If that is not done the precursor gas flows can already react excessively early, for example in the supply lines, and the desired coating is not achieved.

A further essential step in the process according to the invention provides that the ratio of the volume gas flows ($\dot{V}$) of the precursor gas mixtures (VG1, VG2) $\dot{V}(VG1)/\dot{V}(VG2)$ is less than 1.5. If the ratio of the volume gas flows ($\dot{V}$) of the precursor gas mixtures (VG1, VG2) $\dot{V}(VG1)/\dot{V}(VG2)$ is greater than 1.5 that does not give the desired properties for the $Ti_{1-x}Al_xC_yN_z$ layer, in particular not the preferential orientation of crystal growth with respect to the {111} plane of the crystal lattice, which herein is defined as the ratio of the intensities of the X-ray diffraction peaks $I\{111\}/I\{200\}$ and according to the invention is to be $>1+h (\ln h)^2$, wherein h is the thickness of the $Ti_{1-x}Al_xC_yN_z$ layer in 'μm'.

In a preferred embodiment of the invention the process temperature in the CVD reactor is in the range of 650° C. to 800° C., preferably in the range of 657° C. to 750° C.

If the process temperature in the CVD reactor is too high contents of hexagonal AlN are obtained in the layer, whereby inter alia the layer hardness falls.

If the process temperature in the CVD reactor in contrast is too low the deposit rate can drop into an uneconomical range. In addition at low temperatures layers with chlorine contents >1 at-% and of lower hardness are obtained.

In a further preferred embodiment of the invention the process pressure in the CVD reactor is in the range of 0.2 to 7 kPa, preferably in the range of 0.4 to 1.8 kPa.

If the process pressure in the CVD reactor is too high that leads to an irregular layer thickness distribution on the tools with increased layer thickness at the edges, the so-called dog bone effect. In addition high proportions of hexagonal AlN are frequently obtained.

A process pressure in the CVD reactor of less than 0.2 kPa in contrast is technically difficult to implement. In addition at an excessively low process pressure uniform coating of the tools is no longer guaranteed.

In a further preferred embodiment of the invention the ratio of the volume gas flows ($\dot{V}$) of the precursor gas mixtures (VG1, VG2) $\dot{V}(VG1)/\dot{V}(VG2)$ is less than 1.25, preferably less than 1.5.

If the ratio of the volume gas flows ($\dot{V}$) of the precursor gas mixtures (VG1, VG2) is too high a preferential orientation other than the {111} preferential orientation according to the invention is generally attained.

In a further preferred embodiment of the invention the concentration of $TiCl_4$ in the precursor gas mixture (VG1) and the concentration of N-donor in the precursor gas mixture (VG2) are so set that the molar ratio of Ti to N in the volume gas flows $\dot{V}(VG1)$ and $\dot{V}(VG2)$ introduced into the reactor in stage c) is ≤0.25.

It was surprisingly found that, with a higher molar ratio of Ti to N the volume gas flows $\dot{V}(VG1)$ and $\dot{V}(VG2)$ introduced into the reactor contains highly Ti-rich layers, in particular when using ammonia ($NH_3$) as the N-donor. It is assumed that with an excessively high ratio of Ti to N in the volume gas flows the reaction of the $AlCl_3$ is depressed by virtue of complexing between $TiCl_4$ and the N-donor.

In a further preferred embodiment of the invention the second precursor gas mixture (VG2) contains ≤1.0 vol-%, preferably ≤0.6 vol-% of the N-donor.

If the concentration of the N-donor, optionally mixed with C-donor, is excessively high in the second precursor gas mixture (VG2) the desired composition and crystallographic preferential orientation is not achieved.

In a further preferred embodiment of the invention the wear-protection coating is subjected to a blasting treatment with a particulate blasting agent, preferably corundum, under conditions such that the $Ti_{1-x}Al_xC_yN_z$ layer after the blasting treatment has residual stresses in the range of +300 to −5000 MPa, preferably in the range of −1 to −3500 MPa.

If the residual compressive strength of the $Ti_{1-x}Al_xC_yN_z$ layer is too high that can involve spalling of the coating at the edges of the tool.

If in contrast there are residual tensile stresses in the $Ti_{1-x}Al_xC_yN_z$ layer then optimum resistance of the tool to an alternating thermomechanical loading or in relation to the formation of comb cracks is not achieved.

Dry or wet blasting treatment can advantageously be used for producing the preferred residual stresses in the $Ti_{1-x}Al_xC_yN_z$ layer. The blasting treatment is desirably performed at a blasting agent pressure of 1 bar to 10 bars.

The duration of the blasting treatment and the required blasting pressure, required for introducing the residual stresses according to the invention, are parameters which the man skilled in the art can ascertain within the limits defined herein by simple experiments. A broad sweeping specification is not possible here as the residual stresses which occur depend not only on the duration of the blasting treatment and the blasting pressure but also the structure and the thickness of the overall coating. It will be noted however in that respect that, in comparison with the blasting duration, the blasting pressure has a substantially greater influence on the change in the residual stresses in the coating and the substrate body. Suitable blasting treatment durations are usually in the range of 10 to 600 seconds.

The blasting angle, that is to say the angle between the treatment jet and the surface of the tool, also has a substantial influence on the introduction of residual stresses. With a blasting jet angle of 90° maximum introduction of residual compression stresses occurs. Lower blasting jet angles, that is to say applying the jet of blasting agent at an inclined angle, lead to more severe abrasion of the surface and lower introduction of residual compressive stress.

The invention also embraces a tool having a base body of carbide, cermet, ceramic, steel or high speed steel and a single-layer or multi-layer wear-protection coating applied thereto in a CVD process, wherein the wear-protection coating has at least one $Ti_{1-x}Al_xC_yN_z$ layer having stoichiometry coefficients $0.70 \leq x < 1$, $0 \leq y < 0.25$ and $0.75 \leq z < 1.15$ characterised in that the $Ti_{1-x}Al_xC_yN_z$ layer is of a thickness of 1 µm to 25 µm and has a crystallographic preferential orientation, which is characterised by a ratio of the intensities of the X-ray diffraction peaks of the crystallographic {111} plane and the {200} plane, wherein $I\{111\}/I\{200\} > 1 + h (\ln h)^2$, wherein h is the thickness of the $Ti_{1-x}Al_xC_yN_z$ layer in 'µm'.

In a preferred embodiment of the invention the full-width half-maximum (FWHM) of the X-ray diffraction peak of the {111} plane of the $Ti_{1-x}Al_xC_yN_z$ layer <1%, preferably <0.6%, particularly preferably <0.45%.

An excessively high full-width half-maximum of the X-ray diffraction peak of the {111} plane of the $Ti_{1-x}Al_xC_yN_z$ layer points to smaller grain sizes of the cubically face-centred (fcc) phase or even to proportions of amorphous phases. That has proven in previous tests to be disadvantageous in terms of wear resistance.

In a further preferred embodiment of the invention the $Ti_{1-x}Al_xC_yN_z$ layer has at least 90 vol-% $Ti_{1-x}Al_xC_yN_z$ phase with a cubically face-centred (fcc) lattice, preferably at least 95 vol-% $Ti_{1-x}Al_xC_yN_z$ phase with cubically face-centred (fcc) lattice, particularly preferably at least 98 vol-% $Ti_{1-x}Al_xC_yN_z$ phase with cubically face-centred (fcc) lattice.

If the proportion of $Ti_{1-x}Al_xC_yN_z$ phase with cubically face-centred (fcc) lattice is too low a lower level of wear resistance is observed.

In a further preferred embodiment of the invention the $Ti_{1-x}Al_xC_yN_z$ layer has stoichiometry coefficients $0.70 \leq x < 1$, $y=0$ and $0.95 \leq z < 1.15$.

In a further preferred embodiment of the invention the $Ti_{1-x}Al_xC_yN_z$ layer is of a thickness in the range of 3 µm to 20 µm, preferably in the range of 4 to 15 µm.

If the thickness of the $Ti_{1-x}Al_xC_yN_z$ layer is too small the wear resistance of the tool is not adequate.

If in contrast the thickness of the $Ti_{1-x}Al_xC_yN_z$ layer is too high spalling of the layer can occur by virtue of the thermal residual stresses after the coating operation.

In a further preferred embodiment of the invention the ratio of the intensities of the X-ray diffraction peaks of the crystallographic {111} plane and the {200} plane of the $Ti_{1-x}Al_xC_yN_z$ layer $> 1+(h+3)x(\ln h)^2$.

In a further preferred embodiment of the invention the $Ti_{1-x}Al_xC_yN_z$ layer has a Vickers hardness (HV)>2300 HV, preferably >2750 HV, particularly preferably >3000 HV.

In a further preferred embodiment of the invention arranged between the base body and the $Ti_{1-x}Al_xC_yN_z$ layer is at least one further hard material layer selected from a TiN layer, a TiCN layer deposited by means of high temperature CVD (CVD) or medium temperature CVD (MT-CVD), an $Al_2O_3$ layer and combinations thereof. It is particularly preferred if the further layers are applied in the same temperature range, for example by medium temperature CVD (MT-CVD) as the $Ti_{1-x}Al_xC_yN_z$ layer in order to avoid uneconomical cooling times.

In a further preferred embodiment of the invention arranged over the $Ti_{1-x}Al_xC_yN_z$ layer is at least one further hard material layer, preferably at least one $Al_2O_3$ layer of the modification $\gamma$-$Al_2O_3$, $\kappa$-$Al_2O_3$ or $\alpha$-$Al_2O_3$, wherein the $Al_2O_3$ layer is deposited by means of high temperature CVD (CVD) or medium temperature CVD (MT-CVD). It is particularly preferred for the aluminium oxide layer for the above-specified reasons to be applied in the same temperature range, that is to say by medium temperature CVD (MT-CVD) as the $Ti_{1-x}Al_xC_yN_z$ layer to avoid possible phase conversions of the $Ti_{1-x}Al_xC_yN_z$ layer. Processes for the production of $\gamma$-$Al_2O_3$, $\kappa$-$Al_2O_3$ or $\alpha$-$Al_2O_3$ layers in the range of 600 to 850° C. are known to the man skilled in the art, for example from EP 1 122 334 and EP 1 464 727.

In a further preferred embodiment the crystallographic preferential orientation of the {111} plane of the fcc $Ti_{1-x}Al_xC_yN_z$ layer is so pronounced that the absolute maximum, measured radiographically or by means of EBSD, of the {111} intensity of the fcc $Ti_{1-x}Al_xC_yN_z$ layer is within an angle range of $\alpha=\pm10°$, preferably within $\alpha=\pm5°$, particularly preferably within $\alpha=\pm1°$, starting from the normal direction of the sample surface. What is crucial in that respect is the section through the {111} pole figure of the fcc $Ti_{1-x}Al_xC_yN_z$ after integration of the intensities over the azimuth angle $\beta$ (angle of rotation about the sample surface normal).

EXAMPLES

Figure 1:
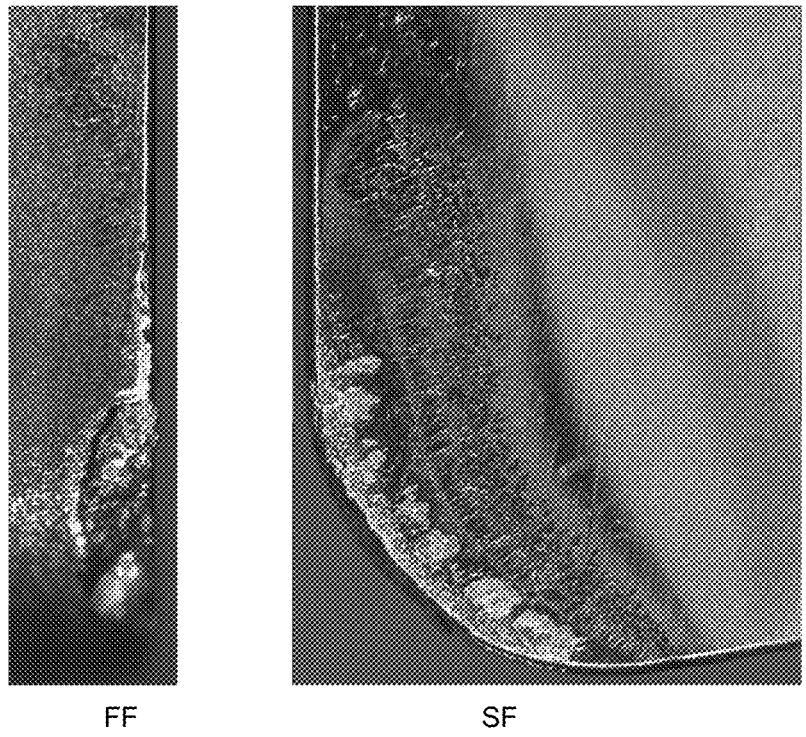
FIG. 1 shows a cutting edge of an indexable cutting bit with coating No 9 according to the state of the art after a turning trial.

Production of Coated Carbide Indexable Cutting Bits

In these examples the substrate bodies used are carbide indexable cutting bits of the geometry CNMA120412 with a composition of 86.5 wt-% WC, 5.5 wt-% Co, 2 wt-% TiC, 6 wt-% (NbC+TaC) and with a mixed-carbide-free edge zone.

For coating the carbide indexable cutting bits a CVD coating installation of the type Bernex BPX325S of a reactor height of 1250 mm and a reactor diameter of 325 mm was used. The gas flow was radially relative to the longitudinal axis of the reactor.

For bonding the $Ti_{1-x}Al_xC_yN_z$ layers according to the invention and the comparative layers a TiN layer or TiCN layer approximately 0.3 μm in thickness was firstly directly applied to the carbide substrate by means of CVD under the deposit conditions set out in Table 1.

TABLE 1

Reaction conditions in the production of bonding layers

| Bonding layer | Temp. [° C.] | Pressure [kPA] | Reactive gas mixture [vol -%] | | | |
|---|---|---|---|---|---|---|
| | | | $TiCl_4$ | $N_2$ | $H_2$ | $CH_3CN$ |
| TiN | 850 | 15 | 0.8 | 44.1 | 55.1 | — |
| TiCN | 830 | 6 | 1.0 | 37.0 | 61.7 | 0.3 |

To produce the $Ti_{1-x}Al_xC_yN_z$ layers according to the invention a first precursor gas mixture (VG1) with the starting compounds $TiCl_4$ and $AlCl_3$ and a second precursor gas mixture (VG2) with the starting compound $NH_3$ as the reactive nitrogen compound were introduced into the reactor separately from each other so that mixing of the two gas flows took place only upon passing into the reaction zone.

The volume gas flows of the precursor gas mixtures (VG1) and (VG2) were so set that in production of coatings according to the invention the ratio of the volume gas flows $\dot{V}(VG1)/\dot{V}(VG2)$ was less than 1.5. The parameters in the production of $Ti_{1-x}Al_xC_yN_z$ coatings according to the invention and comparative coatings are reproduced in Table 3.

Production of Comparative Coatings

Carbide indexable cutting bits as further comparative examples in accordance with the state of the art, were coated with:

a) a 12 μm thick layer system of the sequence TiN/MT-Ti (C,N)/TiN (coating No 9), and b) a 5 μm thick layer system of the sequence TiN/MT-Ti (C,N) (coating No 10). The deposit conditions in accordance with Table 2 hereinafter were used for that purpose:

TABLE 2

Reaction conditions in the production of coatings Nos 9 and 10 (comparative)

| Layers | Temp. [° C.] | Pressure [kPA] | Time [min] | Reactive gas mixture [vol -%] | | | | Thickness [μm] |
|---|---|---|---|---|---|---|---|---|
| | | | | $TiCl_4$ | $N_2$ | $H_2$ | $CH_3CN$ | |
| Coating No 9 | | | | | | | | |
| TiN | 910 | 16 | 60 | 1.1 | 39.6 | 59.4 | — | 0.5 |
| MT-TiCN | 890 | 12 | 220 | 1.8 | 10.7 | 85.9 | 0.9 | 11 |
| TiN | 920 | 80 | 50 | 0.8 | 22.4 | 76.8 | — | 0.5 |
| Coating No 10 | | | | | | | | |
| TiN | 910 | 16 | 30 | 1.1 | 39.6 | 59.4 | — | 0.2 |
| MT-TiCN | 870 | 9 | 105 | 1.8 | 10.7 | 85.9 | 0.9 | 4.8 |

The following methods were used for the investigation of composition, texture, residual stresses and hardness of the coatings.

Both methods of X-ray diffraction (XRD) and also electron diffraction, in particular EBSD, can be used for determining the crystallographic preferential orientation. For the purposes of reliably determining a preferential orientation diffraction measurements at reflections of individual surfaces {hkl} are not appropriate, but the orientation density function (ODF) has to be ascertained. The representation thereof in the form of an inverse pole figure shows the position and sharpness of any fibre texture that may be present. The orientation density function either has to be constructed from a statistically adequate number of individual orientation measurements (in the case of EBSD) or calculated from measurements of a minimum number of pole figures at various reflections {hkl} (with XRD). See in that respect: L Spiess et al, Moderne Rontgenbeugung, 2nd edition, Vieweg & Teubner, 2009.

In the case of the $Ti_{1-x}Al_xC_yN_z$ layers according to the invention XRD measurement of a pole figure set and ODF calculation were used to verify that a fibre structure is involved, with a fibre axis either precisely in the <111> direction or in a crystallographic direction with <10° angular deviation from <111>. The intensity ratio of the {111} and {200} reflections from θ-2θ measurements can be used for quantifying that texture. The position of the fibre axis can be ascertained from the inverse pole figure or the radiographically measured pole figure of the {111} reflection.

X-Ray Diffractometry

X-ray diffraction measurements were implemented on a diffractometer of type GE Sensing & Inspection Technologies PTS3003 using CuKα radiation. For θ-2θ residual stress and pole figure measurements a parallel beam optical system was used, which at the primary side comprised a polycapillary means and a 2 mm pinhole as a collimator. At the secondary side a parallel plate collimator with 0.4° divergence and a nickel $K_β$ filter was used.

Peak intensities and full-width half-maximums were determined on the basis of θ-2θ measurements. After deduction of the background pseudo-Voigt functions were fitted to the measurement data, wherein the $Kα_2$ deduction was effected by means of $Kα_1/Kα_2$ doublet matching. The values in respect of intensities and full-width half-maximums set out in Table 4 relate to the $Kα_1$ interferences fitted in that way. The lattice constants are calculated in accordance with Vegard's law on the assumption of the lattice constants of TiN and AlN from PDF-cards 38-1420 and 46-1200 respectively.

Distinguishing Between Cubically Face-Centred (Fcc) $Ti_{1-x}Al_xC_yN_z$ and Hexagonal AlN The {101} and {202} interferences of hexagonal AlN and the {111} and {222} reflection of cubic $XTi_{1-x}Al_xC_yN_z$ can be mutually superposed to a greater or lesser degree depending on the respective chemical composition. Only the interference of the {200} plane of the cubic $Ti_{1-x}Al_xC_yN_z$ is superposed by no further interferences, like for example by the substrate body or layers arranged thereabove or therebelow, and has the highest intensity for random orientation.

For judging the volume proportion of hexagonal AlN in the measurement volume and for avoiding misinterpretations in respect of the {111} and {200} intensities of the cubic $Ti_{1-x}Al_xC_yN_z$ measurements (0-20 scans) were carried out at two different tilt angles ψ (ψ=0° and ψ=54.74°). As the angle between the plane normals of {111} and {200} is about 54.74° there is an intensity maximum of the {200} reflection at the tilt angle ψ=54.74° in the case of a strong {111} fibre texture while the intensity of the {111} reflection tends towards zero. Conversely with the tilt angle ψ=54.74° there is a strong intensity maximum of the {111} reflection with a strong {200} fibre texture while the intensity of the {200} reflection tends towards zero.

For the textured layers produced in accordance with the examples it is possible in that way to check whether the measured intensity at 2θ≈38.1° is to be predominantly associated with the cubically face-centred $Ti_{1-x}Al_xC_yN_z$ phase or whether greater proportions of hexagonal AlN are contained in the layer. Both X-ray diffraction measurements and also EBSD measurements identically show only small proportions of hexagonal AlN phase in the layers according to the invention.

Pole Figures

Pole figures of the {111} reflection were implemented at 2θ=38.0° over an angle range of 0°<α<75° (increment 5°) and 0°<β<360° (increment 5°) with a circular arrangement of the measurement points. The intensity distribution of all measured and back-calculated pole figures was approximately rotationally symmetrical, that is to say the layers investigated exhibited fibre textures. For checking the preferential orientation pole figures were measured in addition to the {111} pole figure at the {200} and {220} reflections. The orientation density distribution function (ODF) was calculated with the software LaboTex3.0 from LaboSoft, Poland, and the preferential orientation represented as an inverse pole figure. With the layers according to the invention the intensity maximum was in the <111> direction or ≤10° angle deviation from <111>.

Residual Stress Analyses

For residual stress analyses in accordance with the $sin^2\psi$ method the {222} interference of the cubically face-centred $Ti_{1-x}Al_xC_yN_z$ layer was used and measurements were made at 25 ψ angles of −60° to 60° (increment 5°). After background deduction, Lorentz polarisation correction and $K\alpha_2$ deduction (Rachinger separation) the line positions of the interferences were determined by means of adaptation of profile functions to the measurement data. The elastic constants used were $\frac{1}{2}s_2$=1.93 $TPa^{-1}$ and $s_2$=−0.18 $TPa^{-1}$. The residual stress in the WC phase of the carbide substrate was determined in the same manner on the basis of the {201} interference using the elastic constants $\frac{1}{2}s_2$=1.66 $TPa^{-1}$ and $s_1$=−0.27 $TPa^{-1}$.

Residual stresses are usually specified in the unit Megapascal (MPa), in which respect residual tensile stresses are identified by a positive sign (+) and residual compressive stresses with a negative sign (−).

EDX Measurements (Energy-Dispersive X-Ray Spectroscopy)

EDX measurements were carried out on a scanning electron microscope Supra 40 VP from Carl Zeiss with 15 kV acceleration voltage with an EDX spectrometer type INCA x-act from Oxford Instruments, UK.

Microhardness Determination

Measurement of microhardness was effected in accordance with DIN EN ISO 14577-1 and −4 with a universal hardness tester of type Fischerscope H100 from Helmut Fischer GmbH, Sindelfingen, Germany, on a polished section of the coated bodies.

Blasting Treatment

The carbide indexable cutting bits coated in the examples were subjected after the CVD coating operation to a compressed air dry jet blasting treatment. The residual stresses in the $Ti_{1-x}Al_xC_yN_z$ layer and in the substrate (WC) were measured prior to and after the blasting treatment. The jet blasting parameters used and the measured residual stress values are set forth in Table 5.

TABLE 3

Deposit conditions $Ti_{1-x}Al_xC_yN_z$-Lage

Deposit conditions $Ti_{1-x}Al_xC_yN_z$-Layer

| Coating No | Bonding layer | Temp. [° C.] | Pressure [kPa] | Time [min] | Precursor gas mixture [vol-%] | | | | | Precursor gas mixture VG2 [vol-%] | | | Ratio volume gas flows V̇ (VG1)/V̇ (VG2) | Thickness $Ti_{1-x}Al_xC_yN_z$ [μm] |
|---|---|---|---|---|---|---|---|---|---|---|---|---|---|---|
| | | | | | $H_2$ | $N_2$ | $TiCl_4$ | $AlCl_3$ | $CH_3CN$ | $H_2$ | $N_2$ | $NH_3$ | | |
| 1 (Inv) | TiN | 700 | 1 | 260 | 40.88 | — | 0.08 | 0.32 | 0 | 36.56 | 21.2 | 0.96 | 0.7 | 12 |
| 2 (Inv) | TiN | 700 | 1 | 260 | 54.35 | — | 0.03 | 0.25 | 0 | 45.00 | — | 0.37 | 1.2 | 6 |
| 3 (Inv) | TiN | 700 | 1 | 260 | 53.33 | — | 0.06 | 0.25 | 0 | 27.95 | 16.2 | 2.21 | 1.2 | 11 |
| 4 (Inv) | TiN | 700 | 1.2 | 360 | 52.69 | — | 0.02 | 0.16 | 0 | 46.90 | — | 0.23 | 1.1 | 11 |
| 5 (Inv) | TiN | 700 | 1.2 | 180 | 52.69 | — | 0.02 | 0.16 | 0 | 46.90 | — | 0.23 | 1.1 | 4.5 |
| 6 (Inv) | TiN | 670 | 1.2 | 300 | 52.69 | — | 0.02 | 0.16 | 0 | 46.90 | — | 0.23 | 1.1 | 5 |
| 7 (Inv) | TiCN | 720 | 1.2 | 150 | 52.69 | — | 0.02 | 0.16 | 0.1 | 46.79 | — | 0.23 | 1.1 | 4 |
| 8 (Comp) | TiN | 700 | 1 | 260 | 68.45 | — | 0.08 | 0.31 | 0 | 28.33 | — | 2.83 | 2.2 | 12 |

TABLE 4

X-ray diffraction data and elementary compositions of the $Ti_{1-x}Al_xC_yN_z$-Layers

| Coating No | X-ray diffraction intensities* | | I(111)/I(200) | Full-width half-maximum of the 111-Reflection [°]* | Lattice constant a* | Elementary composition according to EDX-analysis [atom-%]* | | | | | x in $Ti_{1-x}Al_xC_yN_z$* according to EDX-analysis | Micro-hardness [$HV_{0.05}$] |
|---|---|---|---|---|---|---|---|---|---|---|---|---|
| | I(111) | I(200) | | | | Ti | Al | N | C | Cl | | |
| 1 (Inv) | 2628 | 32 | 184 | 0.556 | 4.101 ± 0.007 | 12.3 | 31.9 | 55.1 | 0 | 0.7 | 0.72 ± 0.1 | 2750 |
| 2 (Inv) | 1389 | 114 | 67 | 0.409 | 4.094 ± 0.014 | 10.5 | 35.1 | 54.2 | 0 | 0.2 | 0.77 ± 0.1 | n.m.** |
| 3 (Inv) | 1738 | 21 | 136 | 0.414 | 4.080 ± 0.001 | n.m. | n.m. | n.m. | n.m. | n.m. | — | n.m.** |
| 4 (Inv) | 5502 | 98 | 182 | 0.444 | 4.097 ± 0.011 | 10.6 | 34.6 | 54.6 | 0 | 0.2 | 0.77 ± 0.06 | 2939 |
| 5 (Inv) | 2253 | 135 | 17 | 0.406 | 4.090 ± 0.009 | n.m. | n.m. | n.m. | n.m. | n.m. | — | n.m.** |
| 6 (Inv) | 2635 | 85 | 38 | 0.411 | 4.084 ± 0.004 | 6.3 | 41 | 52.5 | 0 | 0.3 | 0.87 ± 0.01 | n.m.** |
| 7 (Inv) | 3898 | 92 | 42 | 0.451 | 4.095 ± 0.009 | 8.8 | 37.1 | 51.7 | 2.3 | 0.1 | 0.81 ± 0.1 | 3040 |
| 8 (Comp) | 120 | 2297 | 0.06 | 3.25 | 4.129 ± 0.004 | 16.8 | 26.1 | 55.5 | 0 | 1.6 | 0.61 ± 0.03 | 1800 |

*Average of measurements on 4 samples at different reactor positions
**n.m. = not measured

TABLE 5

Blasting treatment and residual stress measurements of various coatings

| Sample | Coating No | Blasting agent | Blasting spacing [mm] | Blasting pressure [bar] | Blasting duration [s] | Residual stress prior to blasting [MPa] | | Residual stress after blasting [MPa] | |
|---|---|---|---|---|---|---|---|---|---|
| | | | | | | WC | $Ti_{1-x}Al_xC_yN_z$ | WC | $Ti_{1-x}Al_xC_yN_z$ |
| S1 | 2 | Fused corundum (280-320 mesh) | 90 | 3 | 6 | −1032 | +1286 | −997 | −41 |
| S2 | 4 | Fused corundum (280-320 mesh) | 90 | 3 | 6 | −766 | +884 | −706 | +167 |
| S3 | 2 | Fused corundum (280-320 mesh) | 90 | 3 | 30 | −1079 | +1286 | −156 | −532 |
| S4 | 4 | Fused corundum (280-320 mesh) | 90 | 3 | 30 | −832 | +793 | −104 | −418 |
| S5 | 5 | Fused corundum (Grain size 106-150 μm) | 90 | 1.5 | 10 | −113 | +682 | −3627 | −3371 |
| S6 | 5 | Fused corundum (Grain size 106-150 μm) | 90 | 2 | 30 | −113 | +682 | −4062 | −4378 |
| S7 | 4 | SiC (Grain size 45-75 μm) | 90 | 1.5 | 24 | −766 | +833 | −1876 | −1392 |
| S8 | 5 | $ZrO_2$ (Grain size 80-125 μm) | 90 | 4 | 20 | −156 | +598 | −1096 | −832 |
| S9 | 5 | $ZrO_2$ (Grain size 80-125 μm) | 90 | 6.5 | 20 | −209 | +743 | −883 | −498 |

Cutting Trials—Turning

Carbide indexable cutting bits of the geometry CNMA120412 of a composition of 86.5 wt-% WC, 5.5 wt-% Co, 2 wt-% TiC, 6 wt-% (NbC+TaC) and with a mixed carbide-free edge zone were coated with the CVD coatings Nos 1 and 8 set forth in Table 3 and with the above-described coating No 9 (TiN/MT-$Ti_{1-x}Al_xC_yN_z$ layer (C,N)/TiN). The total layer thickness for all tools was about 12 μm. Longitudinal turning machining operations were carried out with the cutting inserts, under the following cutting conditions:
Workpiece material: grey cast iron GG25
Cooling fluid: emulsion
Feed: f=0.32 mm
Cutting depth: $a_p$=2.5 mm
Cutting speed: $v_c$=200 m/min.

Figure 2:
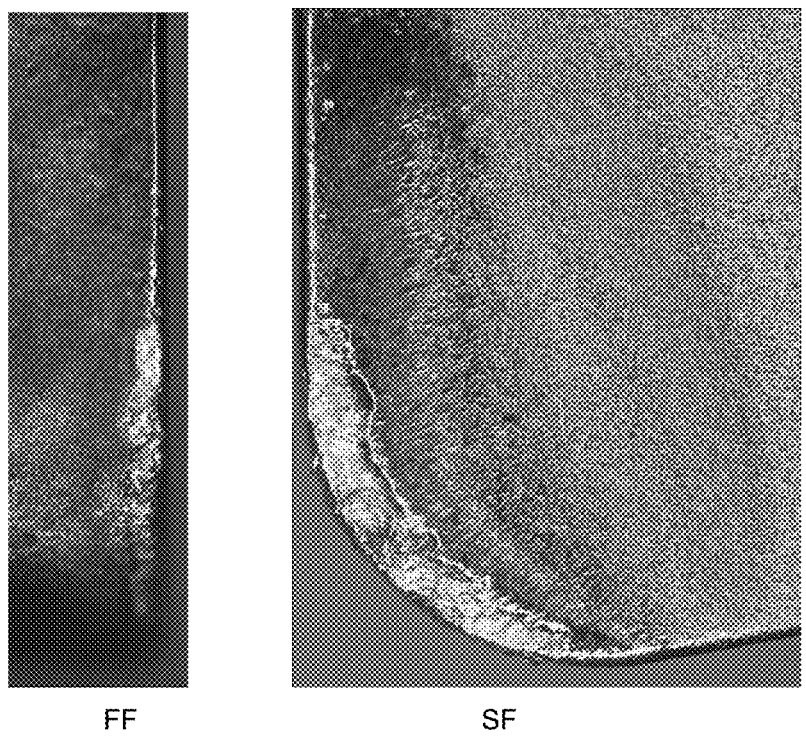
FIG. 2 shows a cutting edge of an indexable cutting bit with coating No 8 according to the state of the art after a turning trial.
Figure 3:
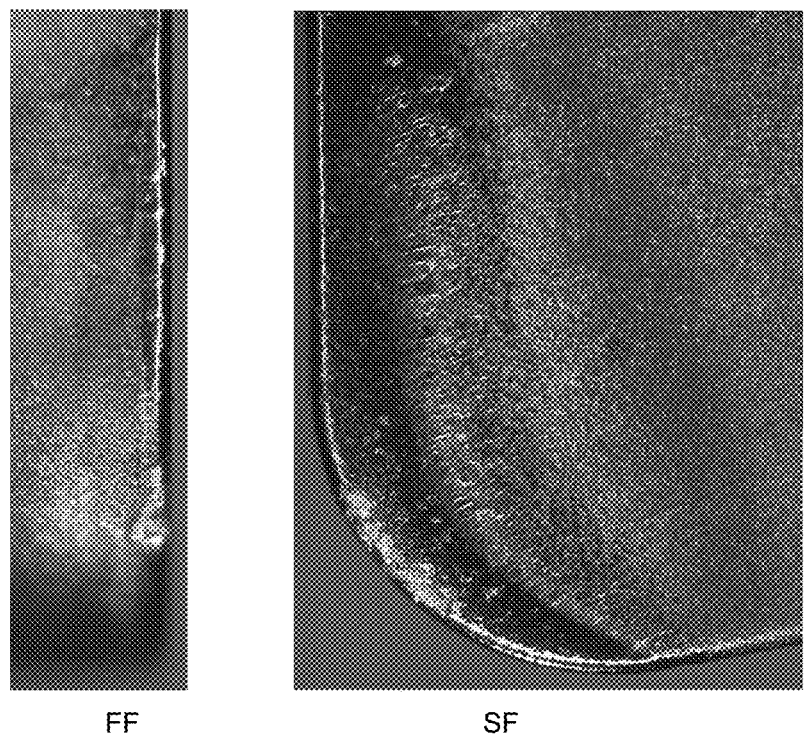
FIG. 3 shows a cutting edge of an indexable cutting bit with $Ti_{1-x}Al_xC_yN_z$ coating No 1 according to the invention after a turning trial.
Figure 4:
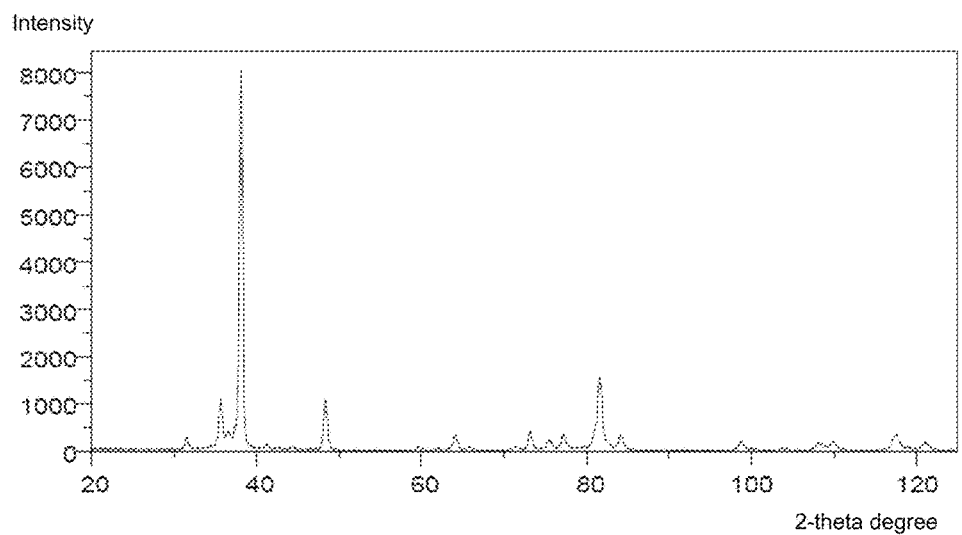
FIG. 4 shows the X-ray diffractogram of coating No 4 (invention)
Figure 5:
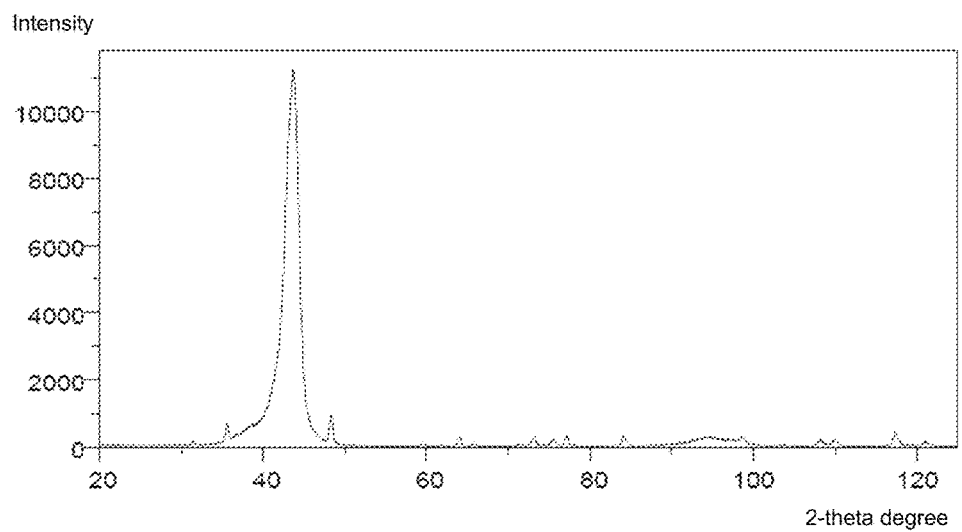
FIG. 5 shows the X-ray diffractogram of coating No 8 (state of the art)
Figure 6:
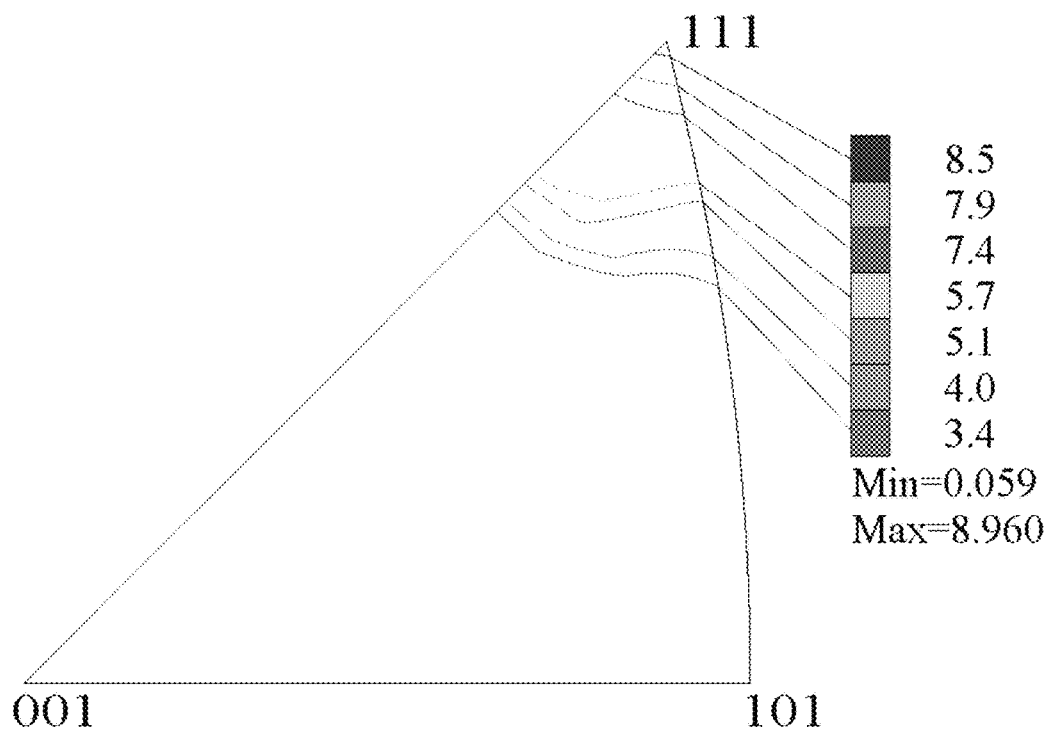
FIG. 6 shows an inverse pole figure for the normal direction of coating No 1 (invention)
Figure 7:
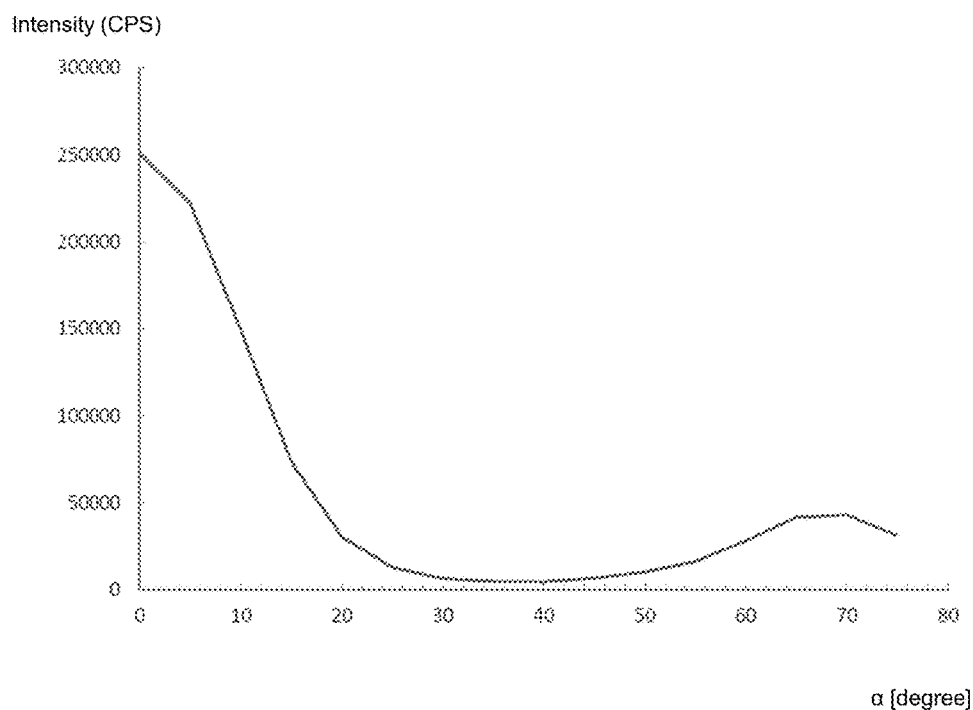
FIG. 7 shows a section through the pole figure of the X-ray diffractogram after integration over $\beta$ of coating No 1 (invention)
Figure 8:
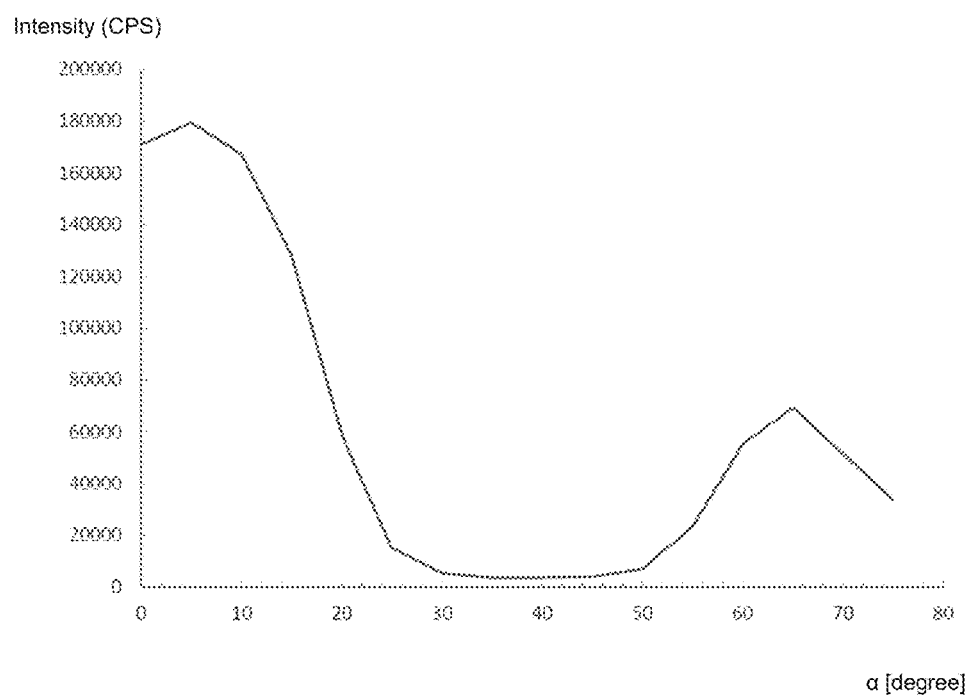
FIG. 8 shows a section through the pole figure of the X-ray diffractogram after integration over $\beta$ of coating No 2 (invention).

FIGS. 1 to 3 show the cutting edges used of the indexable cutting bits after an engagement time of t=9 min. The two indexable cutting bits according to the state of the art (FIG. 1: coating 9; FIG. 2: coating 8) exhibit large-area spalling of the layer along the cutting edge. In the indexable cutting bit with the $Ti_{1-x}Al_xC_yN_z$ layer according to the invention (FIG. 3: coating 1) scarcely any spalling is to be observed.

Cutting Trials—Milling (1)

Carbide indexable cutting bits of the geometry SEHW1204AFN of a composition of 90.47 wt-% WC, 8 wt-% Co and 1.53 wt-% TaC/NbC were coated with the CVD coatings Nos 4 and 8 set forth in Table 3. The total layer thickness in all tools was about 11 μm. Milling operations were performed under the following cutting conditions with the cutting inserts:
Workpiece material: spheroidal graphite cast iron GGG70 strength 680 MPa)
Co-directional, dry machining
Tooth feed: $f_z$=0.2 mm
Cutting depth: $a_p$=3 mm Cutting speed: $v_c$=185 m/min
Setting angle: κ=45°
Working engagement: $a_e$=98 mm
Projection: $u_e$=5 mm.

Then the maximum wear mark width $v_{B,max}$ was determined at the main cutting edge after 3200 m milling travel:

| Coating No | Wear mark width $v_{B,max}$ [mm] |
|---|---|
| 4 (Invention) | 0.25 |
| 8 (State of the art): | 0.35 |

Cutting Trials:—Milling (2)

Carbide indexable cutting bits of the geometry SEHW1204AFN of a composition of 90.47 wt-% WC, 8 wt-% Co and 1.53 wt-% TaC/NbC were coated with the CVD coating No 5 set forth in Table 3 and with the above-described coating No 10 (TiN/MT-Ti (C,N). Indexable cutting bits with coating No 5 were used on the one hand in the unblasted condition and on the other hand after a dry jet blasting treatment with $ZrO_2$ as the blasting agent in accordance with sample S8 in Table 5. Milling operations were carried out under the following cutting conditions with the cutting inserts:
Workpiece material: grey cast iron GGG70
Co-directional, dry machining
Tooth feed: $f_z$=0.2 mm
Cutting depth: $a_p$=3 mm
Cutting speed: $v_c$=283 m/min
Setting angle: κ=45°
Working engagement: $a_e$=98 mm
Projection: $u_e$=5 mm.

The mean wear mark width $v_B$ and the number of comb cracks at the main cutting edge was then determined after 2400 m of milling travel.

| Coating No | Wear mark width $v_B$ [mm] | Comb cracks |
|---|---|---|
| 5 unblasted (Invention) | 0.05 | 3 |
| 5 blasted (Invention) | 0.05 | 0 |
| 10 (State of the art): | 0.10 | 8 |

Cutting Trials:—Milling (3)

Carbide indexable cutting bits of the geometry SEHW1204AFN of a composition of 90.47 wt-% WC, 8 wt-% Co and 1.53 wt-% TaC/NbC were coated with the CVD coating No 5 set forth in Table 3 and with the above-described coating No 10 (TiN/MT-Ti (C,N). Three cutting inserts were tested in respect of each coating variant. Milling operations were carried out under the following cutting conditions with the cutting inserts:
Workpiece material: structural steel ST37 (strength about 500 MPa)
Co-directional, dry machining
Tooth feed: $f_z$=0.3 mm
Cutting depth: $a_p$=6 mm
Cutting speed: $v_c$=299 m/min
Setting angle: κ=75°
Working engagement: $a_e$=50 mm
Projection: $u_e$=350 mm.

The number of comb cracks at the main cutting edge was then determined after 3200 m of milling travel:

| Coating No | Comb cracks |
|---|---|
| 5 (Invention)-1 | 0 |
| 5 (Invention)-2 | 0 |
| 5 (Invention)-3 | 0 |
| 10 (State of the art)-1 | 4 |
| 10 (State of the art)-2 | 3 |
| 10 (State of the art)-3 | 3 |

The invention claimed is:

1. A process for the production of a tool having a base body of carbide, cermet, ceramic, steel or high speed steel and a single-layer or multi-layer wear-protection coating applied thereto in a CVD process, wherein the wear-protection coating has at least one $Ti_{1-x}Al_xC_yN_z$ layer having stoichiometry coefficients 0.70<x<1, 0<y<0.25 and 0.75≤z<1.15 and of a thickness in the range of 1 μm to 25 μm, wherein for production of the $Ti_{1-x}Al_xC_yN_z$ layer
   a) the bodies to be coated are placed in a substantially cylindrical CVD reactor designed for an afflux flow on the bodies to be coated with the process gases in a direction substantially radially relative to the longitudinal axis of the reactor,
   b) two precursor gas mixtures (VG1) and (VG2) are provided, wherein the first precursor gas mixture (VG1) contains
      0.005% to 0.2 vol-% $TiCl_4$,
      0.025% to 0.5 vol-% $AlCl_3$ and
      as a carrier gas hydrogen ($H_2$) or a mixture of hydrogen and nitrogen ($H_2/N_2$), and
   wherein the second precursor gas mixture (VG2) contains
      0.1 to 3.0 vol-% of at least one N-donor selected from ammonia ($NH_3$) and hydrazine ($N_2H_4$), and
      as a carrier gas hydrogen ($H_2$) or a mixture of hydrogen and nitrogen ($H_2/N_2$), and
   wherein the first precursor gas mixture (VG1) and/or the second precursor gas mixture (VG2) optionally contains a C-donor selected from acetonitrile ($CH_3CN$), ethane ($C_2H_6$), ethene ($C_2H_4$) and ethyne ($C_2H_2$) and mixtures thereof, wherein the total vol-% proportion of N-donor and C-donor in the precursor gas mixtures (VG1, VG2) is in the range of 0.1 to 3.0 vol-%,
   c) the two precursor gas mixtures (VG1, VG2) are kept separate before passing into the reaction zone and are introduced substantially radially relative to the longitudinal axis of the reactor at a process temperature in the CVD reactor in the range of 600° C. to 850° C. and a process pressure in the CVD reactor in the range of 0.2 to 18 kPa,
   wherein the ratio of the volume gas flows ($\dot{V}$) of the precursor gas mixtures (VG1, VG2) $\dot{V}$(VG1)/$\dot{V}$(VG2) is less than 1.5.

2. A process according to claim 1, wherein the process includes at least one of: the process temperature in the CVD reactor is in the range of 650° C. to 800° C. and the process pressure in the CVD reactor is in the range of 0.2 to 7 kPa.

3. A process according to claim 1, wherein the ratio of the volume gas flows ($\dot{V}$) of the precursor gas mixtures (VG1, VG2) $\dot{V}$(VG1)/$\dot{V}$(VG2) is less than 1.25.

4. A process according to claim 1, wherein the concentration of $TiCl_4$ in the precursor gas mixture (VG1) and the concentration of N-donor in the precursor gas mixture (VG2) are so set that the molar ratio of Ti to N in the volume gas flows $\dot{V}$(VG1) and $\dot{V}$(VG2) introduced into the reactor in stage c) is ≤0.25.

5. A process according to claim 1, wherein the second precursor gas mixture (VG2) contains ≤1.0 vol-% of the N-donor.

6. A process according to claim 1, wherein the N-donor is ammonia ($NH_3$).

7. A process according to claim 1, wherein the wear-protection coating is subjected to a blasting treatment with a particulate blasting agent under conditions such that the $Ti_{1-x}Al_xC_yN_z$ layer after the blasting treatment has residual stresses in the range of +300 to −5000 MPa.

8. A tool having
   a base body of carbide, cermet, ceramic, steel or high speed steel and
   a single-layer or multi-layer wear-protection coating applied thereto in a CVD process,
   wherein the wear-protection coating includes at least one $Ti_{1-x}Al_xC_yN_z$ layer having stoichiometry coefficients $0.70 \leq x<1$, $0<y<0.25$ and $0.75 \leq z<1.15$, and
   wherein the $Ti_{1-x}Al_xC_yN_z$ layer is of a thickness of 1 μm to 25 μm and has a crystallographic preferential orientation, which is characterised by a ratio of the intensities of the X-ray diffraction peaks of the crystallographic {111} plane and the {200} plane, wherein $I\{111\}/I\{200\}>1+h \,(\ln h)^2$, wherein h is the thickness of the $Ti_{1-x}Al_xC_yN_z$ layer in micrometers.

9. A tool according to claim 8, wherein the full-width half-maximum (FWHM) of the X-ray diffraction peak of the {111} plane of the $Ti_{1-x}Al_xC_yN_z$ layer is <1%.

10. A tool according to claim 8, wherein the $Ti_{1-x}Al_xC_yN_z$ layer has at least 90 vol-% $Ti_{1-x}Al_xC_yN_z$ phase with a cubically face-centred (fcc) lattice.

11. A tool according to claim 8, wherein the $Ti_{1-x}Al_xC_yN_z$ layer has stoichiometry coefficients $0.70 \leq x<1$, $y=0$ and $0.95 \leq z<1.15$.

12. A tool according to claim 8, wherein the $Ti_{1-x}Al_xC_yN_z$ layer has a thickness in the range of 3 μm to 20 μm.

13. A tool according to claim 8, wherein the ratio of the intensities of the X-ray diffraction peaks of the crystallographic {111} plane and the {200} plane of the $Ti_{1-x}Al_xC_yN_z$ layer is $>1+(h+3)\times(\ln h)^2$.

14. A tool according to claim 8, wherein the $Ti_{1-x}Al_xC_yN_z$ layer has a Vickers hardness (HV)>2300 HV.

15. A tool according to claim 8, wherein the wear-protection coating includes at least one of:
   arranged between the base body and the $Ti_{1-x}Al_xC_yN_z$ layer, at least one layer selected from a TiN layer, a TiCN layer deposited by means of high temperature CVD (CVD) or medium temperature CVD (MT-CVD), an $Al_2O_3$ layer and combinations thereof, and
   arranged over the $Ti_{1-x}Al_xC_yN_z$ layer, at least one hard material layer.

16. A tool according to claim 8, wherein an absolute maximum, measured radiographically or by means of EBSD, of the diffraction intensity of the crystallographic {111} planes of the fcc $Ti_{1-x}Al_xC_yN_z$ layer is within an angle range of α=±10°, starting from the normal direction of the sample surface.

17. A tool including a base body of carbide, cermet, ceramic, steel or high speed steel and a single-layer or multi-layer wear-protection coating applied thereto in a CVD process, wherein the wear-protection coating includes at least one $Ti_{1-x}Al_xC_yN_z$ layer having stoichiometry coefficients $0.70<x<1$, $0<y<0.25$ and $0.75<z<1.15$, and wherein the $Ti_{1-x}Al_xC_yN_z$ layer is of a thickness of 1 μm to 25 μm and has a crystallographic preferential orientation, which is characterised by a ratio of the intensities of the X-ray diffraction peaks of the crystallographic {111} plane and the {200} plane, wherein $I\{111\}/I\{200\}>1+h \,(\ln h)^2$, wherein h is the thickness of the $Ti_{1-x}Al_xC_yN_z$ layer in micrometers, produced according to claim 1.

18. A process according to claim 2, wherein the process includes at least one of: the process temperature in the CVD reactor is in the range of 657° C. to 750° C. and the process pressure in the CVD reactor is in the range of 0.4 to 1.8 kPa.

19. A process according to claim 5, wherein the second precursor gas mixture (VG2) contains <0.6 vol-% of the N-donor.

20. A process according to claim 7, wherein the $Ti_{1-x}Al_xC_yN_z$ layer after the blasting treatment has residual stresses in the range of −1 to −3500 MPa.

21. A tool according to claim 9, wherein the full-width half-maximum (FWHM) of the X-ray diffraction peak of the {111} plane of the $Ti_{1-x}Al_xC_yN_z$ layer is <0.6%.

22. A tool according to claim 10, wherein the $Ti_{1-x}Al_xC_yN_z$ layer has at least 98 vol-% $Ti_{1-x}Al_xC_yN_z$ phase with a cubically face-centred (fcc) lattice.

23. A tool according to claim 14, wherein the $Ti_{1-x}Al_xC_yN_z$ layer has a Vickers hardness (HV) in the range of 2750 HV to 3040 HV.

24. A tool according to claim 15, wherein the at least one hard material layer arranged over the $Ti_{1-x}Al_xC_yN_z$ layer includes at least one $Al_2O_3$ layer of the modification γ-$Al_2O_3$, κ-$Al_2O_3$ or α-$Al_2O_3$, and wherein the $Al_2O_3$ layer is deposited by means of high temperature CVD (CVD) or medium temperature CVD (MT-CVD).

25. A tool according to claim 16, wherein an absolute maximum, measured radiographically or by means of EBSD, of the diffraction intensity of the crystallographic {111} planes of the fcc $Ti_{1-x}Al_xC_yN_z$ layer is within an angle range of α=±5°, starting from the normal direction of the sample surface.

* * * * *

UNITED STATES PATENT AND TRADEMARK OFFICE
CERTIFICATE OF CORRECTION

PATENT NO. : 9,976,213 B2  
APPLICATION NO. : 14/781622  
DATED : May 22, 2018  
INVENTOR(S) : Dirk Stiens, Sakari Ruppi and Thorsten Manns Page 1 of 1

It is certified that error appears in the above-identified patent and that said Letters Patent is hereby corrected as shown below:

In the Claims

Claim 1, Column 14, Line 17: "$0.70<x<1, 0<y<0.25$" should read --$0.70\leq x<1, 0\leq y<0.25$--.

Claim 8, Column 15, Line 18: "$0<y<0.25$" should read --$0\leq y<0.25$--.

Signed and Sealed this  
Twenty-fifth Day of February, 2020

Andrei Iancu  
*Director of the United States Patent and Trademark Office*